(12) United States Patent
Majhi et al.

(10) Patent No.: US 8,258,498 B2
(45) Date of Patent: *Sep. 4, 2012

(54) QUANTUM WELL MOSFET CHANNELS HAVING UNI-AXIAL STRAIN CAUSED BY METAL SOURCE/DRAINS, AND CONFORMAL REGROWTH SOURCE/DRAINS

(75) Inventors: Prashant Majhi, Austin, TX (US); Mantu Hudait, Portland, OR (US); Jack T. Kavalieros, Portland, OR (US); Ravi Pillarisetty, Portland, OR (US); Marko Radosavljevic, Beaverton, OR (US); Gilbert Dewey, Hillsboro, OR (US); Titash Rakshit, Hillsboro, OR (US); Willman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/017,862

(22) Filed: Jan. 31, 2011

(65) Prior Publication Data

US 2011/0121266 A1 May 26, 2011

Related U.S. Application Data

(60) Continuation of application No. 12/756,989, filed on Apr. 8, 2010, now Pat. No. 7,947,971, which is a division of application No. 12/347,268, filed on Dec. 31, 2008, now Pat. No. 7,759,142.

(51) Int. Cl.
*H01L 29/06* (2006.01)
*H01L 31/072* (2006.01)
*H01L 31/0336* (2006.01)
*H01L 31/0328* (2006.01)
*H01L 31/109* (2006.01)

(52) U.S. Cl. ............ 257/12; 257/24; 257/190; 257/194; 257/E29.069; 257/E29.242

(58) Field of Classification Search .................. None
See application file for complete search history.

(56) References Cited

U.S. PATENT DOCUMENTS

| | | | |
|---|---|---|---|
| 5,953,362 A | 9/1999 | Pamulapati et al. | |
| 6,350,993 B1 * | 2/2002 | Chu et al. ........................ | 257/19 |
| 6,927,414 B2 | 8/2005 | Ouyang et al. | |
| 7,012,274 B2 | 3/2006 | Taylor | |
| 7,112,495 B2 | 9/2006 | Ko et al. | |
| 7,368,766 B2 | 5/2008 | Kamiyama et al. | |
| 7,569,869 B2 | 8/2009 | Jin et al. | |
| 2003/0006407 A1 | 1/2003 | Taylor | |
| 2004/0201037 A1 | 10/2004 | Fareed et al. | |

OTHER PUBLICATIONS

Intel Corp., International Search Report and Written Opinion mailed Jul. 27, 2010; PCT/US2009/069487.

* cited by examiner

*Primary Examiner* — Zandra Smith
*Assistant Examiner* — Khanh Duong
(74) *Attorney, Agent, or Firm* — Blakely, Sokoloff, Taylor & Zafman LLP (57) ABSTRACT

Embodiments described include straining transistor quantum well (QW) channel regions with metal source/drains, and conformal regrowth source/drains to impart a uni-axial strain in a MOS channel region. Removed portions of a channel layer may be filled with a junction material having a lattice spacing different than that of the channel material to causes a uni-axial strain in the channel, in addition to a bi-axial strain caused in the channel layer by a top barrier layer and a bottom buffer layer of the quantum well.

17 Claims, 8 Drawing Sheets

QUANTUM WELL MOSFET CHANNELS HAVING UNI-AXIAL STRAIN CAUSED BY METAL SOURCE/DRAINS, AND CONFORMAL REGROWTH SOURCE/DRAINS

CROSS-REFERENCE TO RELATED APPLICATION

This application is a continuation of U.S. patent application Ser. No. 12/756,989 filed Apr. 8, 2010 issued as U.S. Pat. No. 7,947,971 on May 24, 2011, which is a divisional of U.S. patent application Ser. No. 12/347,268 filed Dec. 31, 2008, entitled QUANTUM WELL MOSFET CHANNELS HAVING UNI-AXIAL STRAIN CAUSED BY METAL SOURCE/DRAINS, AND CONFORMAL REGROWTH SOURCE/DRAINS issued as U.S. Pat. No. 7,759,142 on Jul. 20, 2010.

BACKGROUND

1. Field

Circuit devices and the manufacture and structure of circuit devices.

2. Background

Increased performance in circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often favored to increase movement of electrons in N-type MOS device (n-MOS) channels and to increase movement of positive charged holes in P-type MOS device (p-MOS) channels. A key parameter in assessing device performance is the current delivered at a given design voltage. This parameter is commonly referred to as transistor drive current or saturation current ($I_{Dsat}$). Drive current is affected by factors that include the transistor's channel mobility and external resistance. Thus, device performance is affected by channel mobility (e.g., carrier mobility in the channel between the source and drains); and the external resistance (Rext) (e.g., the external resistance seen between a contact to the source and a contact to the drain).

The mobility of carriers (i.e. holes and electrons) in the transistor's channel region may be affected by the channel material composition, doping, and strain (e.g. tensile or compressive strain). Increased carrier mobility translates directly into increased drive current at a given design voltage and gate length. Carrier mobility can be increased by straining the channel region's lattice. For p-MOS devices, carrier mobility (i.e. hole mobility) is enhanced by generating a compressive strain in the transistor's channel region. For n-MOS devices, carrier mobility (i.e. electron mobility) is enhanced by generating a tensile strain in the transistor's channel region.

Rext may be affected by channel material composition, doping, and strain. Rext may also be affected by source/drain material composition and doping; source/drain contact composition and doping; and interfaces between source/drain contacts and the source and drain material. External resistance may be referred to as the sum of: (1) the resistances associated with the ohmic contacts (metal to semiconductor and semiconductor to metal), (2) the resistance within the source/drain region itself, (3) the resistance of the region between the channel region and the source/drain regions (i.e. the tip region), and (4) the interface resistance due to impurity (carbon, nitrogen, oxygen) contamination at the location of the initial substrate-epi-layer interface.

Some transistors use a "quantum well" (QW), such as between a source and drain. A quantum well is a concept that includes design of a channel "stack" to confine an energy region for carriers that participate in transport, for a MOSFET device. Here the confined energy region (e.g. a layer) is a region with a lower bandgap that is confined between a top layer and a bottom layer, each having a higher bandgap. For example, a quantum well may include a layer of germanium (Ge) or a layer of silicon germanium (SiGe) between two layers of silicon. Alternatively, the quantum well may include a layer of indium gallium arsenide (InGaAs) between a top layer of indium phosphide (InP), and a bottom layer of indium aluminum arsenide (InAlAs). In each case, the top layer may be described as a "buffer" and/or top "barrier" layer to provide confinement of carriers in "channel" layer and also minimize scattering effect of defects in gate stack on the carrier mobility in the channel (e.g., for a buried channel structure). Also, the bottom layer may be described as a bottom "buffer" layer such as to provide confinement of carriers in "channel" layer (like the top layer) and also improve the electrostatic integrity by insulating the channel from the bulk (e.g., for a SOI like scheme).

Below the bottom buffer layer may be a substrate. The substrate may be a bulk style substrate or a silicon-on-insulator (SOI) substrate. The substrate may include a graded buffer below the QW bottom buffer. Below the graded buffer may be another buffer layer or a substrate layer, such as a silicon handle wafer. Alternatively, below the bottom barrier may be an insulator layer, and then a substrate, such as to form a silicon-on-insulator (SOI) or heterostructure-on-insulator (HOI) structure. Generally, layers below the QW bottom buffer layer may be described as the substrate, or as part of the substrate.

DETAILED DESCRIPTION

Locally straining transistor quantum well (QW) channel regions may be accomplished by metal source/drains, and conformal regrowth source drains to impart a uni-axial strain in a MOS transistor's channel region. Such process flows may involve removing portions of a channel layer of a quantum well in a substrate (and layers above the channel layer) to form junction regions in the substrate, adjacent to the channel quantum well. A thickness of a junction material may then be formed in the junction regions, wherein the junction material has a lattice spacing different than a lattice spacing of a channel material of the channel layer and causes a uni-axial strain in the channel layer between the junction regions.

In some embodiments, this uni-axial strain may be in addition to a bi-axial strain caused in the channel layer by a top barrier layer and a bottom buffer layer of the quantum well. Specifically, the channel layer may be formed on a bottom buffer layer, and a top barrier layer may be formed on the channel layer, wherein the top barrier layer and the bottom buffer layer each have a material with a lattice spacing different than a lattice spacing of the channel material and each cause a bi-axial strain in the channel layer, in addition to the uni-axial strain.

Figure 1:
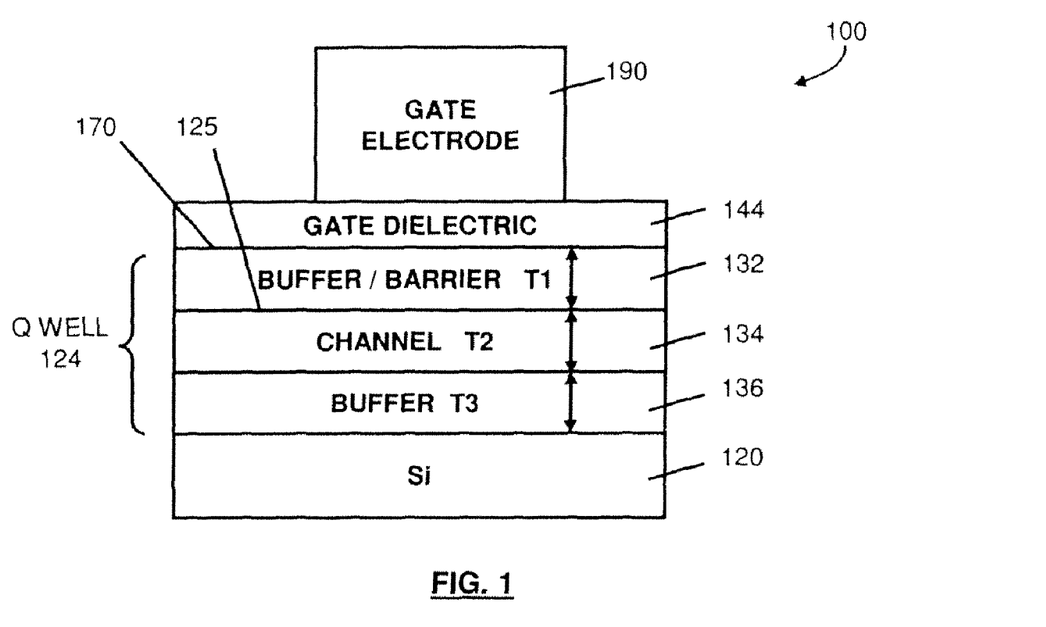
FIG. 1 is a schematic cross-sectional view of a portion of a substrate having a quantum well, gate dielectric, and gate electrode.

For example, according to some embodiments described with respect to FIGS. 1-6, locally straining transistor quantum well (QW) channel regions may be accomplished by metal source/drains. FIG. 1 is a schematic cross-sectional view of a portion of a substrate having a quantum well, gate dielectric, and gate electrode. FIG. 1 shows apparatus 100 including substrate 120 having gate dielectric 144 formed on top surface 125 of substrate quantum well (QW) 124. Gate electrode 190 is formed on gate dielectric 144. QW 124 includes top barrier or buffer layer 132 that is or that includes a barrier material having thickness T1, formed on or touching channel layer 134. Channel layer 134 is or includes a channel material having thickness T2 formed on or touching buffer layer 136. Buffer layer 136 is made of or includes a buffer material and has thickness T3. Buffer layer 136 may be formed on or be touching substrate 120. Gate dielectric 144 may be formed on or touching layer 132. Surface 170 of layer 132 is shown extending under gate electrode 190. Apparatus 100, and components thereof described above may be further processed, such as in a semiconductor transistor fabrication process that involves one or more processing chambers, to become or be parts of a QW p-MOS or n-MOS transistor (e.g., by being parts of a CMOS device).

For example, substrate 120 may include, be formed from, deposited with, or grown from polycrystalline silicon, single crystal silicon, or various other suitable technologies for forming a silicon or other material base or substrate (such as a silicon wafer). For example, according to embodiments, substrate 120 may be formed by growing a single crystal silicon substrate base, or may be formed by sufficient chemical vapor deposition (CVD) of various appropriate silicon or silicon alloy materials. It is also considered that substrate 120 may include one or more layers of a relaxed, non-relaxed, graded, and/or non-graded silicon alloy material. It can be appreciated that other substrates, as know in the art for quantum well devices, may be used for substrate 120.

As shown in FIG. 1, substrate 120 includes QW 124. Quantum well 124 includes a channel (e.g., layer 134 or channel 534) to confine an energy region for carriers that participate in transport, for a MOSFET device. Here the confined energy region (e.g. the channel) is a region with a lower bandgap that is confined between top barrier layer and bottom buffer layer, each having a higher bandgap. For example, a quantum well may include layer 134 of germanium (Ge) or silicon germanium (SiGe) between layers 132 and 136 of silicon.

It can be appreciated that layer 134 may include various materials suitable for forming a QW "channel" of a transistor device. For example, a transistor device QW channel may be defined as a portion of the channel material of QW 124 under top or layer 132 above layer 136, and between surfaces of junctions formed adjacent to, electrode 190. Specifically, a source and a drain may be formed adjacent to QW 124, so that QW 124 (e.g., so that so that QW 594 of FIG. 5) is a quantum well between the source and drain. The source and drain may each be a junction region, such as an opening formed adjacent to, or through a quantum well (e.g., through a channel layer), and then filled with junction material.

QW 124 may be an N-type well having an electrically negative charge formed by doping QW 124 during formation or after formation of QW 124. Specifically, to form QW 124, top surface 170 may be doped with phosphide, arsenic, and/or antimony to form an N-type well of a p-MOS transistor (e.g., a p-MOS device of a CMOS device). Alternatively, to form QW 124, top surface 120 may be doped with boron and/or aluminum to form a P-type well of an n-MOS transistor (e.g., a n-MOS device of a CMOS device). Doping as described herein may be performed, for example, by angled doping, or by selective doping, such as by placing a mask over the non-selected area or areas to block the introduction of the dopant from entering the non-selected are or areas, while allowing the dopant to dope QW 124 (e.g., doping the channel layer). Similarly, the junction regions may be N-type, or may be P-type junction regions.

Figure 2:
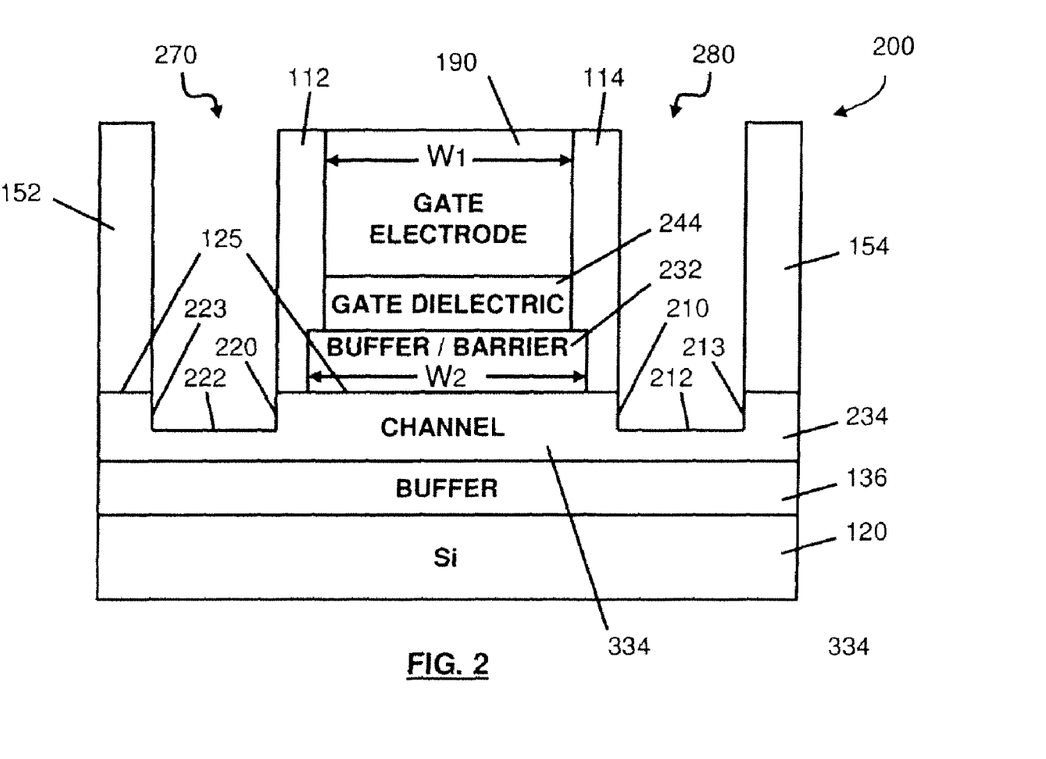
FIG. 2 is the schematic substrate of FIG. 1 after forming an interlayer dielectric (ILD), and forming contact openings through the ILD and to the channel material.

FIG. 2 is the schematic substrate of FIG. 1 after forming an interlayer dielectric (ILD), and forming contact openings through the ILD and to the channel material. FIG. 2 shows apparatus 200 including ILD 152, 112, 114 and 154 formed on or touching surface 125, layer 232, dielectric 244 and electrode 190. ILD 112 and 114 may function as spacer 112 and spacer 114 of ILD material formed on surfaces of gate electrode 190, gate dielectric 144, barrier 232, and surface 125 of channel 234. ILD 152 and ILD 154 are also formed on surface 125 of channel 234. Spacers 112 and 114; and ILD 152 and 154, may be a dielectric material know in the art, such as silicon nitride ($Si_3N_4$), silicon dioxide ($SiO_2$), and/or various other appropriate semiconductor device spacer materials.

FIG. 2 also shows contact opening 270 including sidewall surfaces 223 and 220 formed in channel layer 234, and bottom surface 222 (e.g., a surface of the channel material somewhere within thickness T2) formed in channel layer 234. Similarly, contact opening 280 includes sidewall surfaces 210 and 213 formed in channel layer 234 and bottom surface 212 formed in channel layer 234.

According to embodiments, contact openings 270 and 280 may be formed to junction regions adjacent to gate electrode 190. For example, junctions adjacent to gate electrode 190 may be formed by etching through an ILD layer formed on layer 234, and through a thickness of layer 234 to form contact openings or junction regions recesses. Then junction material may be formed or deposited into the junction regions.

For example, dielectric 144 and barrier layer 132 of FIG. 1 may be etched to form dielectric 244 and barrier layer 232 of FIG. 2. Thus, electrode 190 and dielectric 244 have width W1 as shown in FIG. 2, while barrier layer 232 has width W2. Then, a layer of ILD (e.g., a blanket layer or selective layer, not show prior to etching) may be formed over remaining surfaces of (e.g., exposed sidewalls and/or top surfaces) of the gate electrode, gate dielectric, barrier layer (e.g., including remaining parts of surface 170), and surface 125 of the channel layer. The ILD may be described as adjacent to a portion of the top barrier layer, adjacent to the gate dielectric formed on the portion of the top barrier layer, and adjacent to the gate electrode formed on the gate dielectric.

Next, openings (e.g., contact openings) may be formed through the ILD and into channel layer 234, such as by removing portions of the ILD and channel layer to form ILD portions 152, 112, 114 and 154. In some cases, an etch mask may be formed over the top surface of the ILD and/or electrode 190 prior to forming the openings in the ILD. Portions of the mask may be removed to expose the portions of the top surface of the ILD to be etched. The ILD material and channel material may be removed by etching through the openings where portions of the mask were removed. A first and second portion of the ILD and channel layer may be removed to form contact openings 270 and 280 through the ILD layer, and into, but not through the channel layer. Thus, removing may include removing a first thickness of, but not removing a remaining thickness of the channel layer.

For instance, a patterning two operation process may be used where in the first operation, a photo-resist is used to define regions of a hardmask to be removed (e.g., a hardmask layer over apparatus 200 of FIG. 2). Those regions of the hardmask are then etched away. After that etching, the photo-resist is removed, and a recess etch is performed to form junction regions 270 and 280 (e.g., etching away the undesired exposed portions of the ILD and channel layer 234 such as at surface 125, not covered by the remaining hardmask). Photolithographic patterning using an etch stop, dielectric material, photo resist, or other suitable material for masking and etch processing (e.g., a negative photo-resist mask, positive photo-resist mask, silicon dioxide $SiO_2$), or silicon nitride $Si_3N_4$) may also be used to define an area to be protected while source-drain recess etching to form junction regions 270 and 280, as described herein.

According to embodiments removing the first and second portion may include using an anisotropic dry etch (e.g., with a gas) to form contact openings 270 and 280, each extending through a thickness of but not completely through thickness T2 of channel layer 234. For example, junction region 270 and 280 may be formed by removing or etching with etchant gas that may contain mixtures including: chlorine ($Cl_2$), hydrochloric acid (HCl), hydrogen ($H_2$), and/or nitrogen ($N_2$). It can be appreciated that other suitable dry etchants, for anisotropic dry etching the quantum well channel material, may be used.

Removing may form first sidewall 220 of the channel layer and first bottom surface 222 of the channel layer in the first junction region (e.g., opening 270), and to form second sidewall 210 of the channel layer and second bottom surface 212 of the channel layer in the second junction region (e.g., opening 280).

Gate dielectric 144 may be formed of a material having a relatively high dielectric constant (e.g., a dielectric constant greater than or equal to that of silicon dioxide ($SiO_2$), of a material having a relatively low dielectric constant, and may include various suitable materials as know in the art for gate electrics over quantum wells. Gate dielectric 144 may be formed by deposition, such as by CVD, atomic layer deposition (ALD), blanket deposition, and/or other appropriate growing, depositing, or forming processes. Gate dielectric 144 may have an appropriate P-type work function, or an appropriate N-type work function for a MOS device.

Gate electrode 190 may be formed by processes described above with respect to forming gate dielectric 144. Moreover, gate electrode 190 may be formed of various semiconductor or conductor materials, such as silicon, polysilicon, crystal silicon, and/or various other appropriate gate electrode materials. Also, gate electrode 190 may be doped during or after formation to form a p-type gate electrode or to form a n-type gate electrode. In some cases, gate electrode 190 may be formed of TaN/HfSiOx(oxide), or another suitable gate electrode materials as know in the art for quantum wells.

Figure 3:
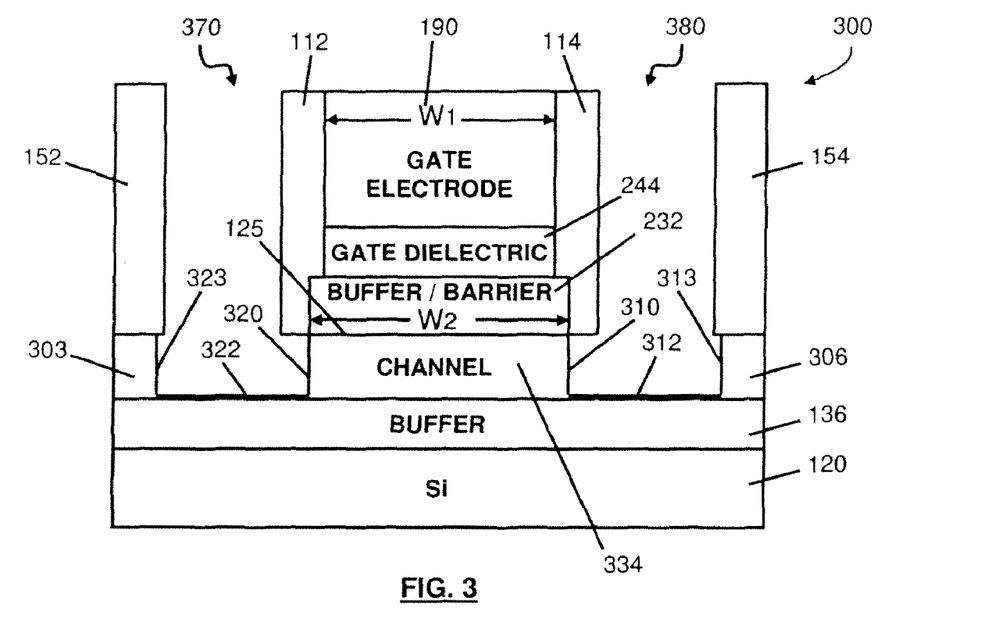
FIG. 3 shows the substrate of FIG. 2 after forming additional openings in the channel material.

FIG. 3 shows the substrate of FIG. 2 after forming additional openings in the channel material. FIG. 3 shows apparatus 300 including contact openings 370 having side surface 323 and 320 formed in channel layer 306, and bottom surface 322 (e.g., a top surface of the bottom buffer layer) formed on surface 334 of buffer layer 136. Similarly, contact opening 380 includes side surfaces 310 and 313 formed in channel layer 306, and bottom surface 312 formed on surface 334 of buffer 136. Surface 334 may be described as the top surface and/or an exposed buffer material surface of buffer 136. Opening 370 separates portion 303 of the channel layer (e.g. layer 134 or 234) from channel 334. Similarly, opening 380 separates portion 306 of the channel layer from channel 334.

Openings 370 and 380 may be contact openings formed by expanding openings 270 and 280 in the channel layer, but not in the top barrier layer. Openings 370 and 380 may be formed using a selective isotropic wet etch (e.g., with a liquid) to extend openings 270 and 280 completely through channel layer 234 to expose a bottom buffer layer 136 of the quantum well. Expanding may include removing the remaining thickness of channel layer 234, and widening the openings 270 and 280 in the channel layer to a width wider than a width of the openings 270 and 280 in the ILD.

The etchant used in the wet etch may be selective to etch the channel material of layer 234, but no to etch the ILD material, or the bottom buffer material of layer 136 (or the gate electrode material). According to embodiments, expanding forms contact openings 370 and 380, each extending completely through thickness T2 of channel layer 234. For example, junction region 370 and/or 380 may be formed by removing or etching with etchant liquids that may contain mixtures including: citric acid, peroxide, HCl, and phosphoric acid. It can be appreciated that other suitable wet etchants, for selective isotropic wet etching the quantum well channel material, may be used.

An etch mask may be used to protect surfaces of the ILD or gate electrode during the wet etch. The etch mask may be the same mask used when forming openings 270 and 280, or may be a different mask (e.g., that stops the wet etchant).

Expanding to form opening 370 may form first sidewall 320 of the channel layer and first bottom surface 322 in the first junction region (e.g., opening 370), and to form second sidewall 310 of the channel layer and second bottom surface 312 in the second junction region (e.g., opening 380). Junction region 370 and 380 may be referred to as "source-drain regions" or "diffusion regions." Also, when an appropriate material is formed, deposited, or grown in junction regions 370 and 380, the resulting material may be referred to as a "junction," a "source," a "drain," or a "diffusion region."

Other embodiments are considered. For example, in some embodiments, a part of the barrier layer 132 may exist in the first and second portions removed to form contact openings 270 and 280. Thus the dry etchant may etch the barrier layer 132 (and the wet etchant may etch through the opening created by the dry etchant) at the first and second portions, as well as the ILD and channel layers to form contact openings 270 and 280. In some embodiments, the ILD may not exist in the first and second portions removed to form contact openings 270 and 280. Thus, the dry etchant may etch channel layer 134 at the first and second portions, but not the ILD to form contact openings 270 and 280. In some cases, neither barrier layer 132, nor the ILD may will exist in the first and second portions removed to form contact openings 270 and 280. Thus, the dry etchant need only etch channel layer 134 at the first and second portions form contact openings 270 and 280.

Figure 4:
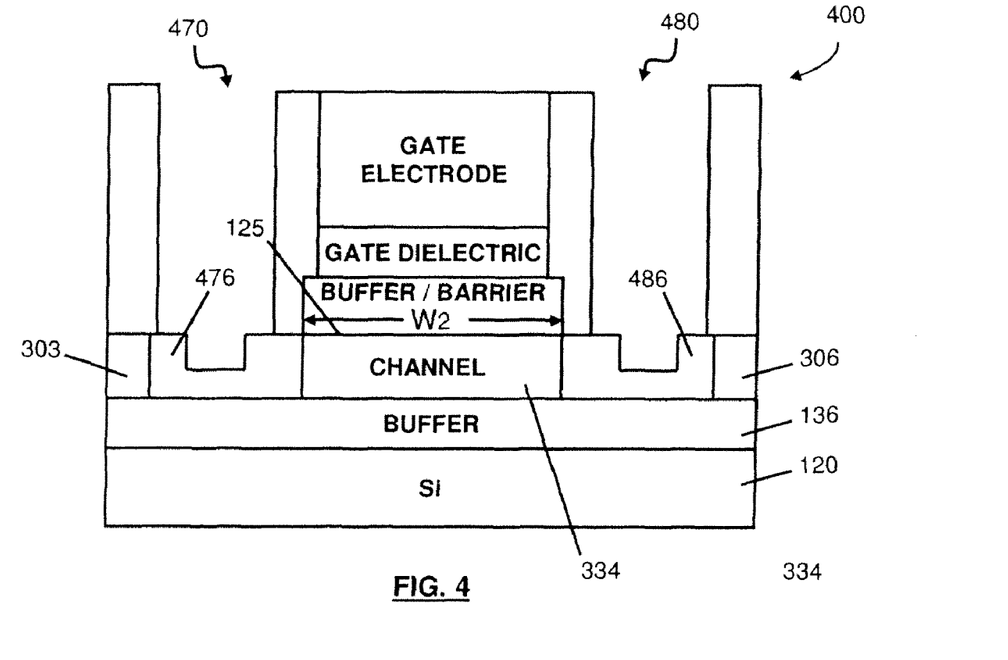
FIG. 4 shows the substrate of FIG. 3 after forming salicide material on the bottom buffer and in the openings in the channel material.

FIG. 4 shows the substrate of FIG. 3 after forming salicide material on the bottom buffer and in the openings in the channel material. FIG. 4 shows apparatus 400 including junction material 476 formed in contact opening 370, such as to form contact opening 470 (e.g., opening 370, now including junction material 476). Similarly, FIG. 4 shows junction material 486 formed in contact opening 380 to form contact opening 480. Junction material 476 forms a bottom surface of contact opening 470 (e.g., a top surface of junction material 476). Similarly, junction material 486 forms a bottom surface of contact opening 480 (e.g., a top surface of junction material 486).

A layer of junction material, such as nickel, cobalt, titanium, or erbium, may be deposited in openings 376 and 386 to form junction material 476 and 486. A conformal, selective, and/or graded layer of material formed by atomic layer deposition (ALD) or chemical vapor deposition (CVD) may be deposited to form junction material 476 and 486. Junction material 476 and 486 may formed on bottom surfaces 322 and 312; and on the channel material sidewall 320 and 310 in the expanded contact openings. However, junction material 476 and 486 may not be formed on barrier material of the top barrier layer 232, and not on the ILD material. Junction material 476 and 486 may formed using atomic layer deposition (ALD), physical vapor deposition (PVD), or other known processes (e.g., for depositing a metal material).

Junction material 476 and 486 may be or include a single metal, such as gold, silver, platinum, copper, nickel, cobalt, titanium, or erbium. In some cases, Junction material 476 and 486 may be or include more than one metal, or an alloy (e.g., of the metals listed above). It can be appreciated that other suitable junction material, as know in the art for having a sufficiently different lattice than quantum well channel material (e.g., as described to meet strain thresholds to at least double channel mobility as compared to universal silicon p-MOS channel material mobility as noted for FIG. 6), may be used.

Figure 5:
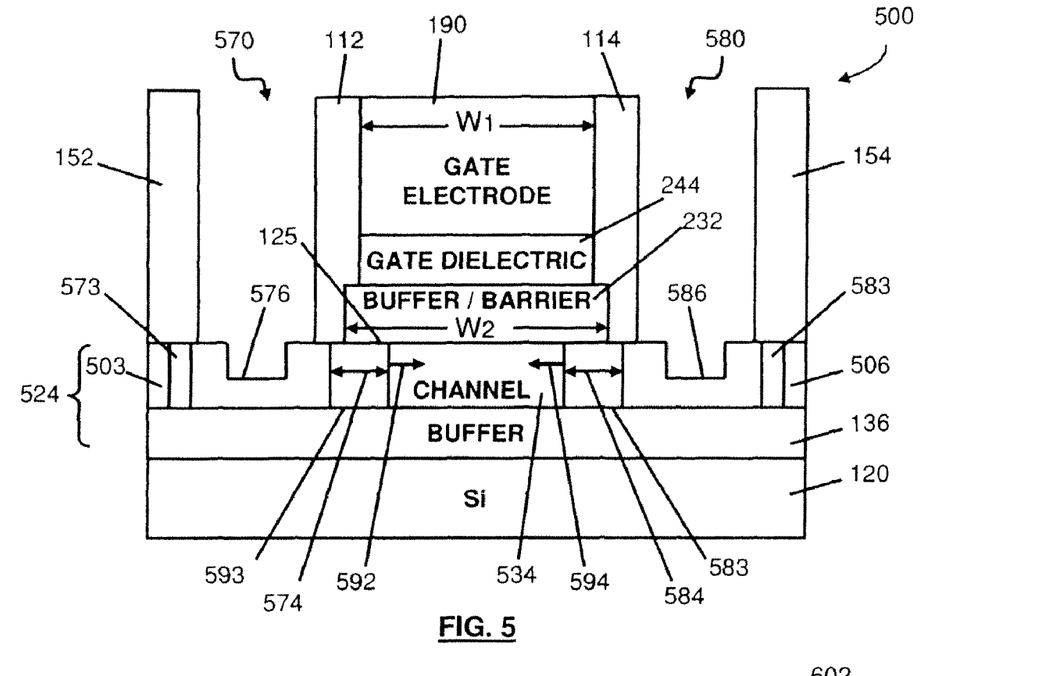
FIG. 5 shows the substrate of FIG. 4 after thermally processing the salicide and channel material.

FIG. 5 shows the substrate of FIG. 4 after thermally processing the salicide and channel material. FIG. 5 shows apparatus 500 including QW 524 having channel 534 adjacent to and touching material 593 and 583. FIG. 5 also shows junction material 576, which forms a bottom surface of contact opening 570 (e.g., a top surface of junction material 576) after thermally treating junction material 476. Similarly, FIG. 5 shows junction material 586, which forms a bottom surface of contact opening 580 (e.g., a top surface of junction material 586) after thermally treating junction material 486.

Thermal treatment of material 476 to form material 576 results in some of material 476 diffusing into and forming an alloy with part of the material of portion 303 to form alloy 573; and with part of the channel material of layer 334 to form alloy 593. During and after thermal treatment, a portion of channel layer 334 remains as channel 534 of the channel layer material, and a portion of material 303 remains as portion 503. Similarly, thermal treatment of material 486 to form material 586 also results in some of material 486 diffusing into and forming an alloy with part of the material of portion 306 to form alloy 581; and with part of the channel material of layer 334 to form alloy 583. During and after thermal treatment, a portion of channel layer 334 remains as channel 534 of the channel layer material, and a portion of material 306 remains as portion 506.

In some embodiments, material 576 and 586 has a different lattice spacing than the channel material of channel 334. Thus, alloy 593 and alloy 583 will also have a lattice spacing that is different than that of channel 534. Materials (e.g., metals as noted above) may be selected or pre-determined for material 576 and 586; and for channel material of layer 534 to ensure a threshold difference in lattice spacing between alloy 593 and alloy 583; as compared to the lattice spacing of the channel material. The threshold difference in lattice spacing can be sufficient to cause alloy 593 and alloy 583 to each have a sufficiently different volume than the channel material to each cause a uni-axial strain in channel 534 to increase (or enhance) channel mobility and to reduce Rext (as compared to without the uni-axial strain) as describe herein (e.g., see FIG. 6). This strain may be caused by the threshold difference causing alloy 593 and alloy 583 to have a larger or smaller volume than the volume of channel material of layer 334 diffusing into by materials 476 and 486 to form alloy 593 and alloy 583. Also note that the greater the amount of junction material that diffuses into channel material at channel 334, the greater the amount of strain alloy portions 593 and 583 will induce in channel 534.

Thermally treating junction material 476 may occur at the same time or during the same thermally treatment as the thermal treatment of material 486. Thermally treating junction material 476 and 486 may be described by heating, annealing, and/or flash annealing material 476 and 486 with sufficient temperature to cause material 476 and 486 to fours a sufficient volume of an alloy with the channel material at an interface (e.g., a junction or border) between the channel material, and material 476 and 486 to cause a uni-axial strain in channel 534 to increase (or enhance) channel mobility and to reduce Rext (as compared to without the uni-axial strain). Thermally treating junction material 476 and 486 may include annealing the interface to form an alloy material between the top barrier layer, the bottom buffer layer, the channel layer and the metal material.

In some embodiments, material 576 and 586 have a larger lattice spacing than the channel material of channel 534, sufficient to increase channel mobility for a p-MOS device having holes as carriers in N-type channel layer 534. Thus, alloy 593 and alloy 583 will also have a lattice spacing and volume, as shown by volume arrows 574 and 584, that is larger than that of material of layer 334 (and 534), and cause a compressing uni-axial strain in channel 534 as shown by strain arrows 592 and 594. As portions 593 and 583 are adjacent to, in contact with, and/or touching channel 534, they may each be described as primarily pushing the channel material away from themselves, thus inducing or causing a uni-axial strain in the channel away from themselves. Moreover, the combination of strains 592 and 594 may be described as a uni-axial strain in the channel layer, such as caused by the junction material portions 593 and 583 having a lattice spacing different than a lattice spacing of the channel material of channel 534 causing a uni-axial strain in channel 534 between portion 593 (e.g. junction region 576 including portions 593) and portion 583 (e.g. junction region 586 including portion 583).

It is also considered that, in some embodiments, material 576 and 586 have a smaller lattice spacing than the channel material, such as of channel 334, such as for an n-MOS device having electrons as carriers in P-type channel layer 534. Thus, alloy 593 and alloy 583 will also have a lattice spacing and volume that is smaller than that of material of layer 334 (and 534), and cause a tensile uni-axial strain in channel 534 in the opposite direction than that shown by strain arrows 592 and 594.

In addition to the uni-axial strain, a first bi-axial strain may be caused or exist in channel 534 in the same direction shown by arrows 592 and 594 (and into and out the cross section shown in FIG. 5) due to the lattice spacing of barrier material of layer 232 being different than that of the channel material. A similar second bi-axial strain may be caused or exist in channel 534 due to the lattice spacing of buffer material of layer 136 being different than that of the channel material. For instance, a bi-axial compressive or tensile strain may exist in channel 534 due to the lattice spacing of barrier material of layer 232 being larger or smaller than that of the channel material, and/or the lattice spacing of buffer material of layer 136 being larger or smaller than that of the channel material, respectively.

In some embodiments, the channel material is or includes germanium (Ge) or silicon germanium; the top barrier and bottom buffer layer is or includes silicon (Si); material 476 and 486 is or includes Nickel (Ni) deposited using atomic layer deposition (ALD) or physical vapor deposition (PVD). Thus, the top barrier and bottom buffer layer silicon has a smaller lattice spacing and a smaller volume than the channel Ge material, sufficient to cause a biaxial compressive strain in the channel Ge material that increases channel mobility and reduces Rext. In addition, after thermal treatment, regions 593 and 583 are or include nickel germanium (NiGe) or nickel silicon germanium (NiSiGe) having a larger lattice spacing and volume than the channel Ge material, sufficient to cause a uni-axial strain in the channel Ge material. The uni-axial strain is in addition to the bi-axial strain and further increases channel mobility and further reduces Rext. It can be appreciated that other suitable materials sufficient to cause a bi-axial compressive strain in a Ge or SiGe quantum well channels, may be used for the channel material, the top barrier material, and/or bottom buffer material.

Figure 6:
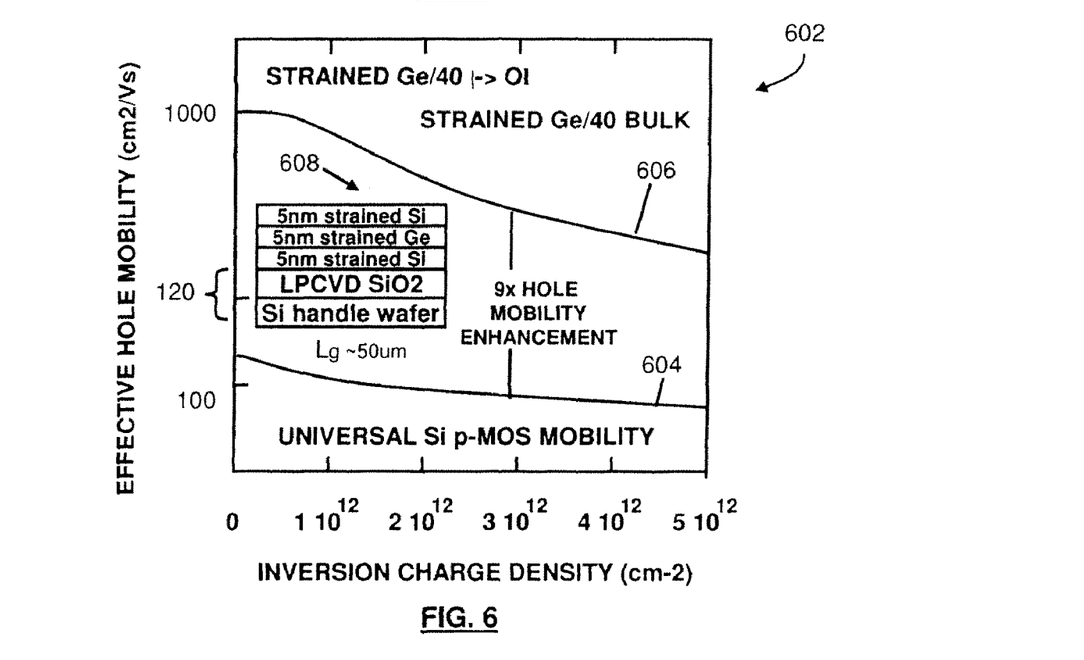
FIG. 6 is a graph showing simulated results for a quantum well having biaxial compressive strain and additional uni-axial compressive strain.

FIG. 6 is a graph showing simulated results for a quantum well having biaxial compressive strain and additional uni-axial compressive strain. It shows the effective hole mobility versus inversion charge density for a universal silicon p-mos mobility device at plot 604. FIG. 6 also shows the hole mobility versus charged density for a strained germanium channel according to some embodiments of the invention at plot 606. For example, plot 606 shows benefits of uni-axial strained channel, as noted above, by plotting an experimental result measured for device 608 having a quantum well with a thickness of 5 nano-meters (nm) of bi-axially strained and uni-axially strained germanium between 5 nm thicknesses of top and bottom barrier strained silicon. The substrate below the bottom buffer may be substrate 120 including a layer of silicon handle wafer, upon which is formed a layer of LPCVD silicon dioxide ($SiO_2$), upon which the bottom buffer layer is formed. As can be seen in FIG. 6, inclusion of the uni-axial strain, in addition to the bi-axial strain, as compared to the universal silicon, increases the hole mobility by approximately nine times.

Figure 11:
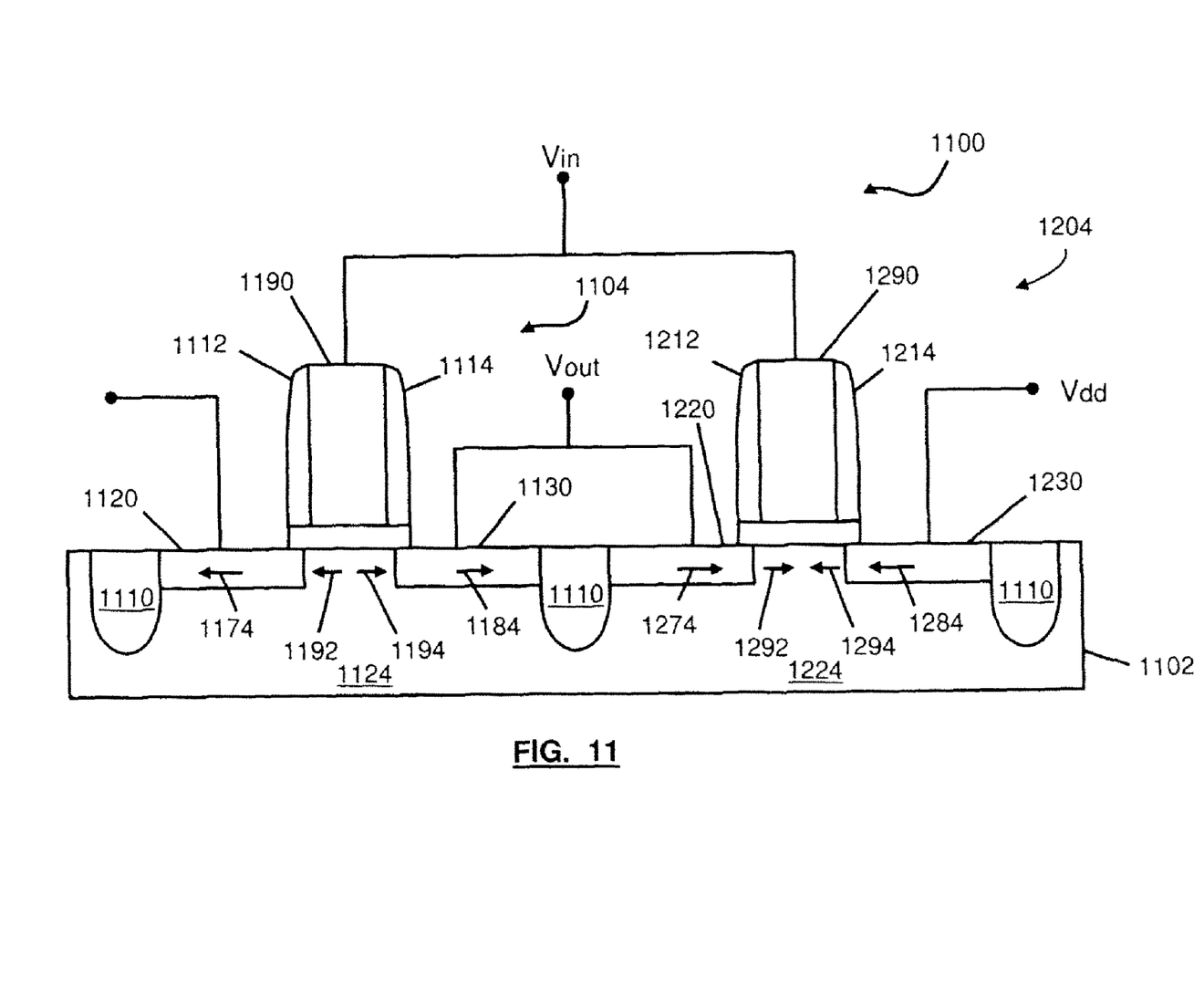
FIG. 11 shows a representative CMOS structure incorporating the substrate of FIG. 5 or of FIG. 10.

Apparatus 500 may be subsequently processed to dope the material of junction material 576 (e.g. possibly including doping portion 593) and junction material 586 (e.g. possibly including doping portion 583) during or after formation to form a p-type junction material or to form an n-type junction material. Apparatus 500 may also be subsequently processed to form contacts to junction material 576 and 586. For example, apparatus 500 may be processed to be part of a CMOS device as shown in FIG. 11.

Some embodiments described above with respect to FIGS. 1-6 may provide uniaxial process induced stress in a Si—Ge based heterostructure quantum well MOSFET. It is observed that for Ge (or SiGe) based channels that are epitaxially deposited on Si, high mobility is realized due to the intrinsically higher mobility of Ge (or SiGe) channels. Simulation (and experimental data) has shown that the mobility of these QWFETs can be enhanced by incorporating a uniaxial stress on top of the biaxial strain (normally associated with lattice mismatch in the epi heterostructure layers of a Si/SiGe/Si heterostructure stack (e.g., see FIG. 6). In embodiments described herein, the Source/Drain regions of a Si—Ge QWFET may be modulated/redesigned (e.g., see FIGS. 1-6) to impart significant stress (uniaxial) on the QW channel. The enhancement with strain for these Si—Ge based QWFETs is similar to that of Si and hence provides a mobility enhancement over strained Si, by using uniaxially strained Si—Ge (in addition to biaxial strain) based QWFETs (e.g., see FIG. 6). This stressing technique also results in very low external resistance since junction material (e.g., metal) is brought very close to the buried channel.

Some embodiments described above with respect to FIGS. 1-6 may include: (1) a Ge channel quantum well MODFET with a strained channel; (2) Quantum Well transistors with uniaxial compressive strain in the channel due to silicide contacts; (3) Quantum Well transistors with biaxial compressive strain in the channel strain due to SiGe buffer architecture; (4) Quantum Well transistors where both uniaxial and biaxial strain are additive; and (5) Silicided source/drain contacts to the Ge QW to improve external resistance. Benefits that may result from these embodiments include:

(a) including high levels of uniaxial stress in a Si—Ge based heterostructure quantum well MOSFET such that the uniaxial stress enhances mobility by a factor of at least 2;

(b) including extremely low external resistance in the Si—Ge QWFET, since the metal source/drain is in close proximity to the channel and one can engineer the alloyed silicide/germanide process to pile up dopants/impurities to control (reduce) the Schottky barrier height of the source/drain to semiconductor channel;

(c) including an intrinsically higher channel mobility for highly scaled (e.g., shorter length channel) devices while being able to maintain the short channel effects similar to Si, by superimposing or adding bi-axial and uni-axial strain in the channel to incorporate higher level of strain (process induced) in the channels.

Some transistors may use type III-V materials in a quantum well. For example, quantum well transistor devices formed in epitaxially grown semiconductor heterostructures, typically in III-V material systems, offer exceptionally high carrier mobility in the transistor channel due to low effective mass along with reduced impurity scattering due to modulation delta doping. These devices provide exceptionally high drive current performance, and appear promising for future low power, high speed logic applications.

According to embodiments, locally straining transistor quantum well (QW) channel regions may be accomplished by conformal regrowth source/drains to impart a uni-axial strain in a MOS transistor's QW channel region, in addition to a bi-axial strain caused in the channel layer by a top barrier layer and a bottom buffer layer of the quantum well. For example, some embodiments described with respect to FIGS. 7-10 may provide a uni-axial strain in a type III-V material QW channel region, in addition to a bi-axial strain caused in the channel layer by a top barrier layer and a bottom buffer layer of the quantum well.

Figure 7:
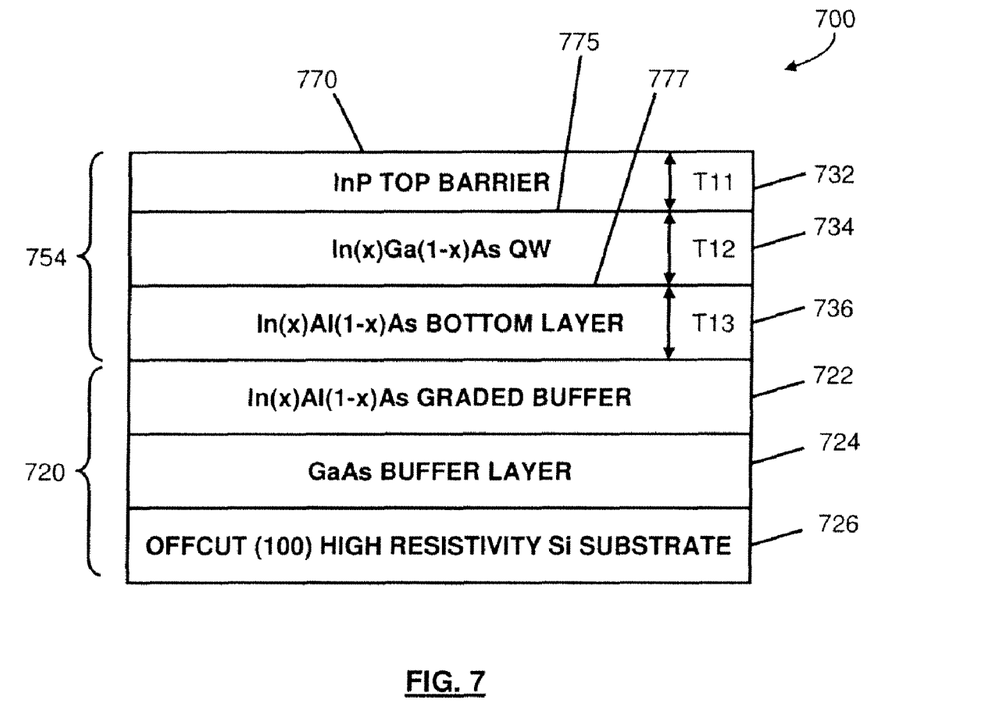
FIG. 7 is a schematic cross sectional view of a portion of a substrate having a quantum well.

FIG. 7 is a schematic cross sectional view of a portion of a substrate having a quantum well. FIG. 7 shows apparatus 700 including quantum well (QW) 754 formed on or touching substrate 720. QW 754 includes top barrier or buffer layer 732 that is or that includes a barrier material having thickness T11, formed on or touching channel layer 734. Buffer layer 732 has top surface 770 and may be formed on top surface 775 of channel layer 734. Channel layer 734 is or includes a channel material having thickness T12 formed on or touching buffer layer 736 (e.g., formed on or touching top surface 777 of buffer layer 736). Buffer layer 736 is made of or includes a buffer material, and has thickness T13. Buffer layer 736 may be formed on or be touching substrate 720.

Substrate 720 is shown including top graded buffer layer 722 that is or that includes a graded buffer material, formed on or touching buffer layer 724. Buffer layer 724 is or includes a buffer material (e.g., non-graded or homogenous) formed on or touching Si substrate layer 726. Layer 726 is made of or includes an offcut high resistivity material.

According to embodiments, top graded buffer layer 722 on substrate 726 may be or include graded indium aluminum arsenide (InAlAs); buffer layer 724 may be or include or include gallium arsenide (GaAs); and Si substrate layer 726 may be or include high resistivity silicon (Si) material. It can be appreciated that other substrates, substrate layers, and/or substrate materials, as know in the art for type III-V quantum wells, may be used for substrate 720. In some cases, substrate 720 may be a substrate as noted above for substrate 120.

Apparatus 700, and components thereof described above may be further processed, such as in a semiconductor transistor fabrication process that involves one or more processing chambers, to become or be parts of a QW p-MOS or n-MOS transistor (e.g., by being parts of a CMOS device).

Figure 10:
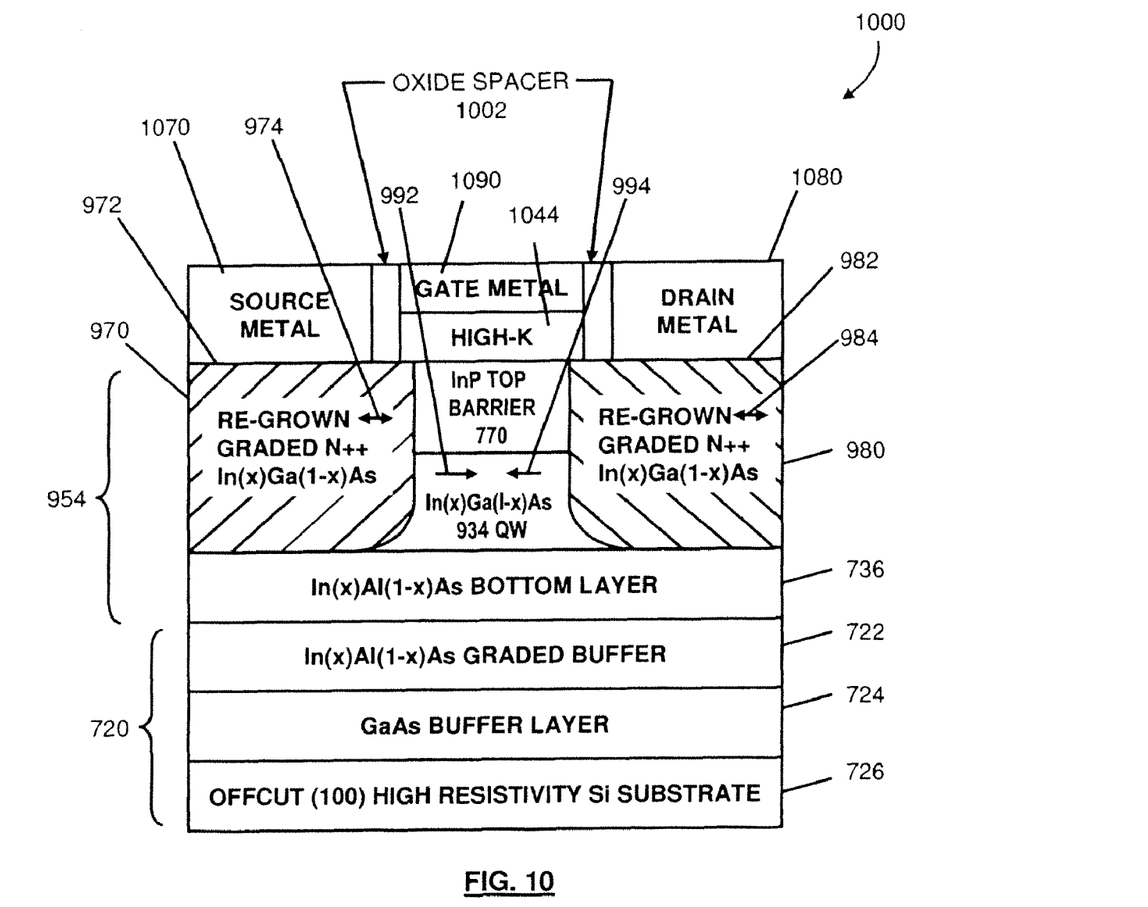
FIG. 10 shows the substrate of FIG. 9 after forming tips; spacers; source/drain metal on the source/drain material; and gate electrode.

It can be appreciated that layer 734 may include various materials suitable for forming a QW "channel" portion of channel material under top or layer 732 above layer 736, and between surfaces of junctions formed adjacent to a gate electrode (e.g., electrode 1090 of FIG. 10). Specifically, a source and a drain may be formed adjacent to QW 735 (e.g., so that so that QW 954 of FIG. 10) is a quantum well between the source and drain. The source and drain may each be a junction region, such as an opening formed adjacent to, or through a quantum well (e.g., through a channel layer), and then filled with junction material.

Quantum well 754 includes a channel (e.g., layer 734 or channel 934) to confine an energy region for carriers that participate in transport, for a MOSFET device. Here the confined energy region (e.g. the channel) is a region with a lower bandgap that is confined between top barrier layer (e.g., layer 732 or channel 932) and bottom buffer layer (e.g., layer 736), each having a higher bandgap.

According to embodiments, buffer layer 732 may be or include indium phosphide (InP); channel layer 734 may be or include indium gallium arsenide (InGaAs); and buffer layer 736 may be or include indium aluminum arsenide (InAlAs). It can be appreciated that other suitable materials sufficient to cause a bi-axial strain in a type III-V materials quantum well, may be used for the channel material, the top barrier material, and/or bottom buffer material.

QW 724 may be an N-type well having an electrically negative charge formed by doping QW 724 during formation or after formation of QW 724, such as described above for doping QW 124. QW 724 may be doped to be N-type, or may be P-type. Similarly, the junction regions may be N-type, or may be P-type junction regions.

Figure 8:
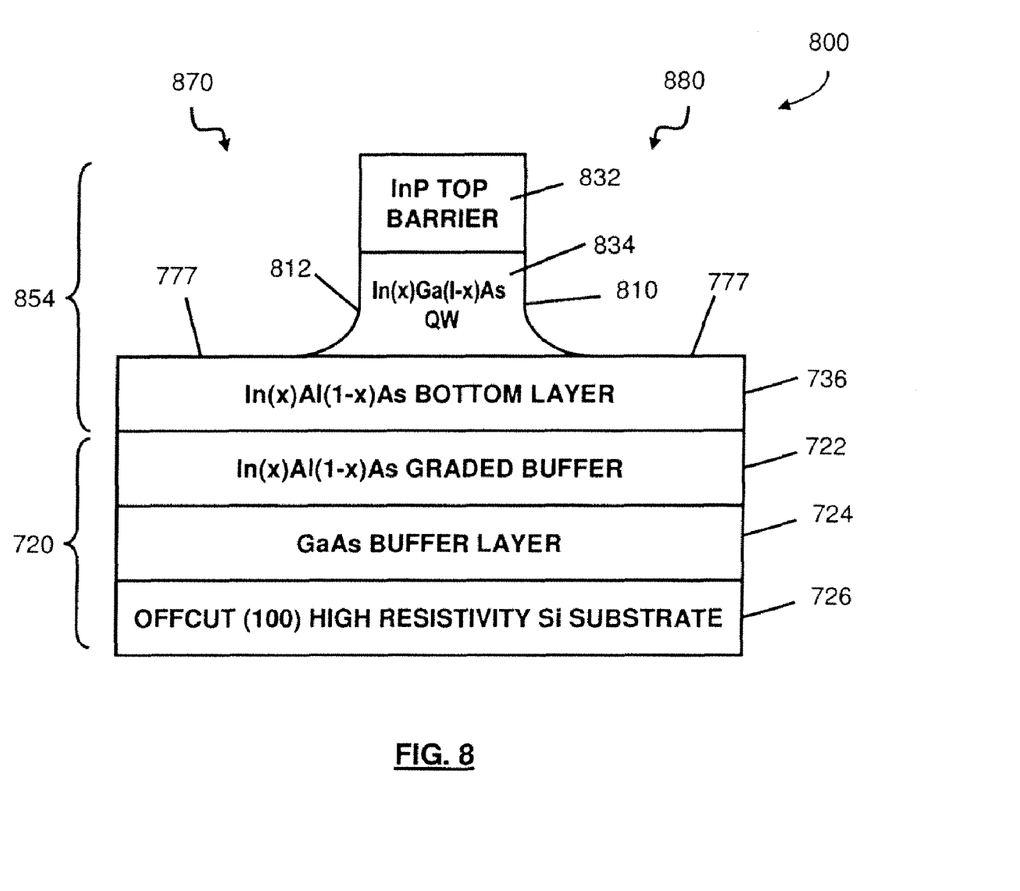
FIG. 8 is a schematic substrate of FIG. 7 after forming source and drain openings through the top barrier and channel layer.

FIG. 8 is a schematic substrate of FIG. 7 after forming source and drain openings through the top barrier and channel layer. FIG. 8 shows apparatus 800 including contact opening 870 including side surface 812 formed in channel layer 834, and a contact opening bottom surface (e.g., top surface 777 of the buffer layer 736). Similarly, contact opening 880 includes side surface 810 formed in channel layer 834, and a contact opening bottom surface (e.g., top surface 777 of the buffer layer 736).

According to embodiments, contact openings 870 and 880 may be formed to form junction regions adjacent to a location for a gate electrode or QW channel of a transistor. For example, junctions may be formed by etching through top QW barrier layer 732, and through layer 734 to form contact openings or junction region recesses. Then junction material may be formed or deposited into the junction regions recesses. Junction region 870 and 880 may be referred to as "source-drain regions" or "diffusion regions." Also, when an appropriate material is formed, deposited, or grown in junction regions 870 and 880, the resulting material may be referred to as a "junction," a "source," a "drain," or a "diffusion region."

For example, openings (e.g., contact openings) may be formed through layer 732, and through layer 734, such as by removing portions of layer 732 and layer 734 to expose a bottom buffer layer 736 of the quantum well (e.g., to expose top surface 777). Forming the openings (e.g., removing) through layer 732 and through layer 734, may form barrier layer 832, channel layer 834. Forming the openings (e.g., removing) may also form first sidewall 812 of channel layer 834, first bottom surface 777 of bottom buffer layer 736 in the first junction region (e.g., opening 870), second sidewall 810 of the channel layer, and second bottom surface 777 of a bottom buffer layer 736 in the second junction region (e.g., opening 880).

In some cases, an etch mask may be formed over top surface 770 prior to forming the openings. Portions of the mask may be removed to expose the portions of the top surface 770 to be etched. Portions of layer 732 and layer 734 may be removed by etching through the openings where portions of the mask were removed. A first and second portion of layer 732 and layer 734 may be removed to form contact openings 870 and 880, through layer 734 to expose top surface 777.

For instance, a patterning two operation process may be used as described above for a hardmask layer over apparatus 200 of FIG. 2. In some cases, the etch mask may be a high K dielectric, such as $HFO_2Al_2$ or $HFO_2Al_3$, that is dry etched to form the openings to expose top surface 770. It can be appreciated that other masks or processes may be used to define an area to be protected while source-drain recess etching to form junction regions 870 and 880, as described herein.

According to embodiments removing the first and second portion may include using a wet etch process (e.g., with a liquid) to form contact openings 870 and 880, each extending completely through thickness T2 of channel layer 734. The wet etch process may be isotropic or anisotropic.

For example, a two etch wet etch process may be used to selectively etch through layer 732, and then to selectively etch through layer 734. The first wet etchant may be selective to etch material of layer 732, but not to etch material of layer 734 (or an etch stop on surface 770). Also, the second wet etchant may be selective to etch material of layer 734, but not to etch material of layer 732 (or an etch stop on surface 770). In some cases, the second wet etchant may be selective to etch material of layer 732 and material of layer 734 (but not to etch an etch stop on surface 770).

For example, junction region 870 and/or 880 may be formed by removing or etching with etchant liquids that may contain mixtures including: citric acid, peroxide, HCl, and phosphoric acid. For example, a mixture of HCl and H2O etches only InP but selective to (e.g., does not etch) InGaAs material. On the other hand, a mixture of phosphoric acid (H3PO4), hydrogen peroxide (H2O2) and H2O etches InGaAs and InAlAs, but is selective to (e.g., does not etch) InP material. It can be appreciated that other suitable wet etchants for selectively wet etching material of layer 732 and then layer 734, may be used.

Figure 9:
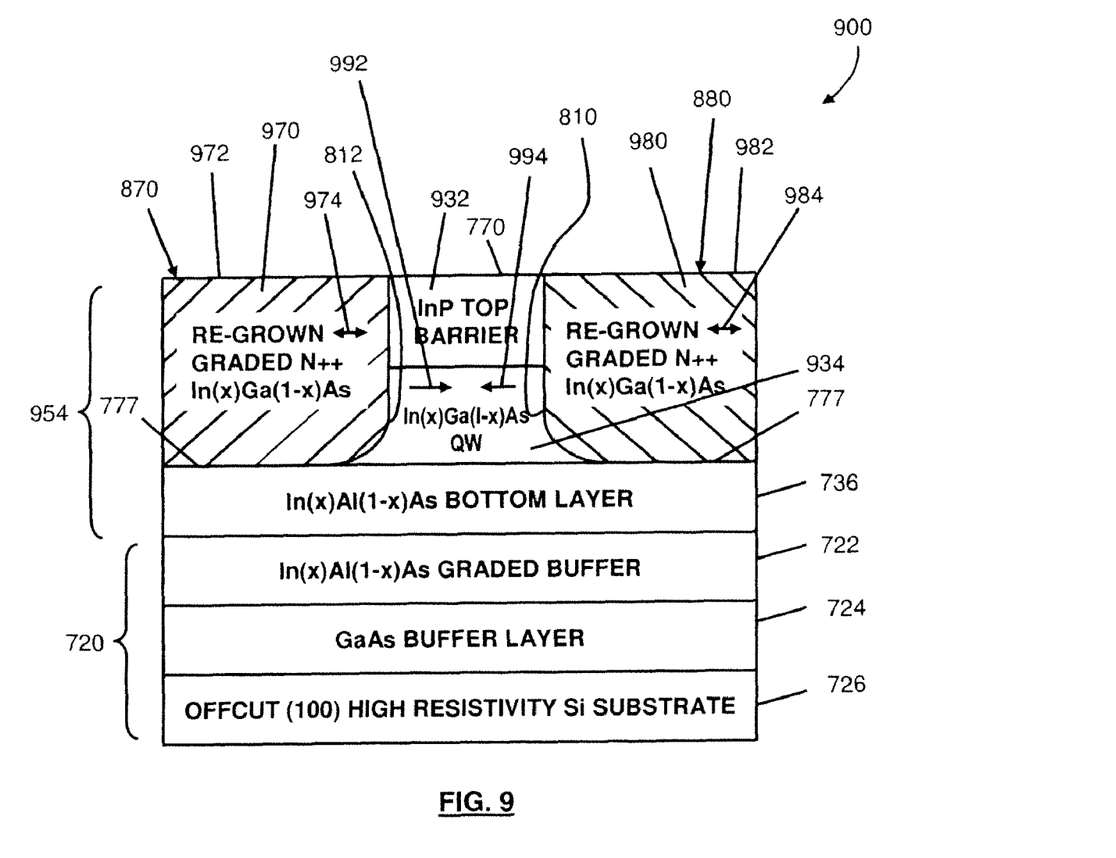
FIG. 9 shows the substrate of FIG. 8 forming re-grown conformal graded channel material in the source and drain openings at low temperature and having a larger lattice constant than the channel, to cause uni-axial strain in the channel.

FIG. 9 shows the substrate of FIG. 8 forming re-grown conformal graded channel material in the source and drain openings at low temperature and having a larger lattice constant than the channel, to cause uni-axial strain in the channel. FIG. 9 shows apparatus 900 including junction material 970 formed in contact opening 870, and junction material 980 formed in contact opening 880. Junction materials 970 and 980 have top surfaces 972 and 982, respectively. FIG. 9 shows apparatus 900 including QW 954 having channel 934 adjacent to an touching material 970 and 980.

According to embodiments, a layer of junction material that is the same material as the material of channel layer 734 (e.g., same as layer 834) may be deposited or grown in openings 870 and 880 to form junction material 970 and 980. A conformal, selective, epitaxial, and/or graded layer of material may be grown to form junction material 876 and 886. In some cases, material 970 and 980 are or include selective epitaxially grown InGaAs material, graded to increase in In concentration while decreasing by an equal amount in concentration of Ga (e.g., the material is In(x)Ga(1-x)As). Epitaxially growning material 970 and 980 from the channel material may be described as "re-growing" the channel material to form the junction material (e.g., of the same material, but having a different concentration of In and Ga).

Junction material 970 and 980 may be formed on bottom surface 777; and on the channel material sidewall 812 and 810 in the contact openings. Junction material 970 and 980 may formed by epitaxially regrowing the channel material (e.g., material of layer 834) in the junction regions. Specifically, material 970 and 980 may be formed by epitaxially growing a graded conformal material, of the same material as the channel material, on the sidewall and bottom surfaces that increases in In concentration from surface 777 to surface 972/982.

Junction material 970 and 980 may be formed by "low temperature" epitaxially re-growth of the channel material. Such growth may include sufficient metal-organic (MO) chemical vapor deposition (CVD), metal-organic vapor phase epitaxy (MOVPE), molecular beam epitaxy (MBE), chemical beam epitaxy (CBE), or atomic layer epitaxy (ALE). "Low temperature" growth may describe growth at a temperature below that used for back end annealing (e.g., below that used to form interconnects to junctions and gate contacts). For example, the junction material may be formed at a temperature less than or equal to 550 degrees Celsius, and cause a uni-axial strain in the channel material due to having a different concentration of In and Ga, prior to annealing. In some embodiments, the temperature may be greater than 400, but less than 550 degrees Celsius.

Junction material 970 and 980 may be formed by low temperature epitaxially re-growth of various appropriate In, Ga and As channel materials to create a layer of InGaAs having a different concentration of In and Ga that of the channel material. In cases where the junction material is graded with respect to In concentration, at least a thickness of the junction material has a different concentration of In and Ga than the channel material.

Thus, due to different In (and Ga) concentrations, material 970 and 980 may each include a thickness that has a lattice spacing that is different than that of channel 934. These different In concentrations, can be selected or pre-determined to ensure a threshold difference in lattice spacing between the junctions and channel material. The threshold difference in lattice spacing can be sufficient to cause material 970 and 980 to each have a sufficiently different volume than the channel material to each cause a uni-axial strain in channel 934 to increase (or enhance) channel mobility and to reduce Rext (as compared to without the uni-axial strain). For some embodiments, it is possible to selected or pre-determined these different In concentrations to tailor the strain to be a strain between from 0 to 3.8 percent (e.g., provide a controlled amount of strain within 10% of the desired strain, which is between 0 and 3.8 percent strain).

In some embodiments, material 970 and 980 has a larger lattice spacing than the channel material of channel 934 (shown by volume arrows 974 and 984), that causes compressive uni-axial strain in channel 934 (shown by strain arrows 992 and 994) sufficient to increase channel mobility for a p-MOS device having holes as carriers in N-type channel layer 934. As material 970 and 980 are adjacent to, in contact with, and/or touching channel 934, they may each be described as primarily pushing the channel material away from themselves, thus inducing or causing a uni-axial strain in the channel away from themselves. Moreover, the combination of strains 992 and 994 may be described as a uni-axial strain in the channel layer, such as caused by the junction material 970 and 980 having a lattice spacing different than a lattice spacing of the channel material of channel 934 causing a uni-axial strain in channel 934 between material 970 and 980.

This strain may be caused by the threshold difference causing material 970 and 980 to each have a larger volume than the volume of channel material of layer. For example, the junction material may be graded to have a concentration of In that increases from 53% at surface 777, to 100% at surface 972/982, while the channel material has a constant or uniform concentration of In, such as at a constant that is between 70% and 100%. In some embodiments, material 970 and 980 may include a thickness of selective epitaxially grown is In(x)Ga(1-x)As material, where x increases from 0.53 at surface 777 to 1.0 at surfaces 972/982; and the channel material is In(x)Ga(1-x)As, where x is between 0.7 and 0.95. In some of these cases, channel material x may be approximately 0.7 or 0.8.

In other embodiments, material 970 and 980 may have a smaller lattice spacing than the channel material of channel 934 to cause a tensile strain to increase electron carrier mobility for an n-MOS device (e.g., to cause a tensile uni-axial strain in channel 934 in the opposite direction than that shown by strain arrows 992 and 994).

In addition to the uni-axial strain, a first bi-axial strain may be caused or exist in channel 934 in the same direction shown by arrows 992 and 994 (and into and out the cross section shown in FIG. 9) due to the lattice spacing of barrier material of layer 932 being different than that of the channel material. A similar second bi-axial strain may be caused or exist in channel 934 due to the lattice spacing of buffer material of layer 736 being different than that of the channel material. For instance, a bi-axial compressive or tensile strain may exist in channel 934 (similar strain to the uni-axial strain) due to the lattice spacing of barrier material of layer 932 being larger or smaller than that of the channel material, and/or the lattice spacing of buffer material of layer 736 being larger or smaller than that of the channel material, respectively.

In some embodiments, the top barrier and bottom buffer layer have a smaller lattice spacing and a smaller volume than the channel material, sufficient to cause a bi-axial compressive strain in the channel material that increases channel mobility and reduces Rext. In these embodiments, the channel material is or includes uniform In(x)Ga(1-x)As, where x is between 0.7 and 0.95; and the junction material is or includes epitaxially grown In(x)Ga(1-x)As material, where x increases from 0.53 at surface 777 to 1.0 at surfaces 972/982 to cause a uni-axial strain in the channel that is in addition to the bi-axial strain by an amount sufficient to further increase channel mobility and reduce Rext (e.g., in addition to that of the bi-axial strain). In some embodiments, the top barrier material comprises Indium Phosphide (InP), the bottom buffer layer comprises Indium Aluminum Arsenide (InAlAs), and the uni-axial strain and the bi-axial strains are compressive strains. It can be appreciated that other suitable materials sufficient to cause a bi-axial compressive strain in a type III-V quantum well channels, may be used for the channel material, the top barrier material, and/or bottom buffer material.

FIG. 10 shows the substrate of FIG. 9 after forming tips; spacers; source/drain metal on the source/drain material; and gate electrode. FIG. 10 shows apparatus 1000 including QW 954 having high-K gate dielectric 1044 formed on top surface 770, and gate metal gate electrode 1090 is formed on gate dielectric 1044. Source metal (e.g., source contact) 1070 is formed on surface 972 of material 970; and Drain metal (e.g., drain contact) 1080 is formed on surface 982 of material 980.

Spacers 1002 are formed between and electronically isolate the gate structure (gate dielectric 1044 and gate metal gate electrode 1090) from source/drain (source metal 1070 and drain metal 1080). Gate dielectric 1044, gate metal 1090, source metal 1070 and drain metal 1080 may be formed by processes and include materials sufficient to perform their functions for a type III-V QW as described herein. In some cases, gate dielectric 1044, gate metal 1090, source metal 1070 and drain metal 1080 may be formed by processes and include materials as described for gate dielectric 244, gate electrode 1090, material 476 and material 486.

Apparatus 1000, and components thereof described above may be further processed, such as in a semiconductor transistor fabrication process that involves one or more processing chambers, to become or be parts of a QW p-MOS or n-MOS transistor (e.g., by being parts of a CMOS device). Apparatus 1000 may be subsequently processed to dope the junction material, channel material, gate material to form a p-type material or to form n-type material as appropriate. For example, apparatus 1000 may be processed to be part of a CMOS device as shown in FIG. 11. It is also contemplated that the gate structure can be formed before processing described above for FIGS. 7-9, such as to include in FIG. 7 a gate structure corresponding to that of FIG. 1, but for type III-V QW structure of FIG. 7.

Thus, embodiments described for FIGS. 7-9 may be used for replacing raised metal source/drain contacts made by ion implantation of impurities and subsequent annealing of impurity activation on heavily doped graded larger lattice constant (n++)In(x)Ga(1-x)As source/drain material, with a metal contact on conformal re-growth graded (n++)In(x)Ga(1-x)As source/drain strain engineered III-V quantum well based MOFET device. The ion implantation and subsequent annealing leads to compositional change in the ternary III-V materials (e.g., In0.53Ga0.47As) due to high temperature annealing of dopant activation and ion implantation damage, which embodiments described for FIGS. 7-9 avoid. Also, the poor dopant activation in the source and drain region leads to higher Rext, which impact to the device performance for the ion implantation and subsequent annealing devices, which embodiments described for FIGS. 7-9 avoid. Also, conformal re-growth of larger lattice constant graded HIV materials in the source/drain areas for embodiments described for FIGS. 7-9 increases the strain to the channel III-V materials.

Moreover, as compared to SiGe source/drains, the low temperature conformal growth of larger lattice constant graded In(x)Ga(1-x)As (e.g., x=0.53 to 1) or constant composition source/drain embodiments described for FIGS. 7-9 provide a uni-axial strain to the channel material (e.g., In0.53Ga0.47As) that is tailor made from 0 to 3.8%, which is not possible for SiGe source/drains case. This provides a flexibility of the control of strain in the channel material by grading the source/drain materials using MOCVD, CBE, MBE or ALE. Implementation of uni-axial strain along with bi-axial strain during device structure growth further increase in channel mobility since these two strains are additive.

In addition, as compared to (1) raised source/drain contacts with metal on top of a heavily doped cap layer (e.g., n+-InGaAs), or (2) III-V MOSFET using ion implantation of dopants in the source/drain regions followed by dopant activation and metal contact deposition, embodiments described above with respect to FIGS. 7-10 may result in benefits including:
 1. Lower Rext resistance;
 2. Lower source/drain resistance;
 3. Gate length scalability;
 4. Reduced off-state leakage and minimized parasitic junction leakage;
 5. Only needing a low temperature thermal budget to make alloyed or non-alloyed metal contacts for source/drain formation: Typically processing involves annealing at <450° C. to make an ohmic contact and since there is no source/drain extension or deep ion-implantation process, high temperature implant anneals are not required to make the contacts;
 6. Providing a quantum well based MOSFET without degraded carrier mobility in the channel materials due to annealing at <450° C. to make an ohmic contact;
 7. Viable manufacturability process of fabrication;
 8. Significantly reduced self-aligned structure and source-to-drain spacing; and
 9. Eliminating implantation induced damages as compared to implant and anneal MOSFET fabrication processes.

Although some embodiments are described above with respect to FIGS. 7-10 may be for example QWs including InGaAs/InAlAs, the concepts described above with respect to FIGS. 7-10 may be used for various QW devices, such as: (1) those including various types of type III-V materials; (2) those having delta dopant type selected based on whether the device is to be p-channel or n-channel, whether device operation is majority or minority carrier based, and/or whether the device operates as depletion or enhancement mode; (3) those having the structure grown on a variety of different substrates (other than Silicon); (4) those where the modulation doping can be applied in the bottom barrier; and/or (5) those using a p-channel system where the source/drain regions will be used as a re-growth (P++)InGaAs material.

FIG. 11 shows a representative CMOS structure that embodiment of apparatus 500 or 900 as described above with respect to FIGS. 5 and 10, may be incorporated into. FIG. 11 shows CMOS device 1200 having ground GND, input voltage $V_{in}$, output voltage $V_{out}$, and bias voltage $V_{DD}$ appropriately coupled to junction regions and gate electrodes of the p-MOS and n-MOS transistors of the CMOS device.

For some embodiments, FIG. 11 shows CMOS device 1100 having p-MOS device 1204, such as a p-MOS embodiment of apparatus 500 or 1000 as described above with respect to FIGS. 5 and 10, connected to n-MOS transistor device 1104 in typical fashion. Gate dielectric, gate electrode, junction regions, QW channel, and QW structures of p-MOS device 1204 may correspond with those described for embodiments of apparatus 500 or 1000, such as described above with respect to FIGS. 5 and 10.

For example, with respect to FIG. 5, junction region 1274 may include material 576 (and 593 having strain 574) as described for FIG. 5. Similarly, junction region 1284 may include material 586 (and 593 having strain 584) as described for FIG. 5. Also, well 1224 may include QW 524, with channel 534 having uni-axial strains 592 and 594 as described for FIG. 5.

Also, with respect to FIG. 10, junction region 1274 may include material 970 (having strain 974) as described for FIG. 10. Similarly, junction region 1284 may include material 980 (having strain 984) as described for FIG. 10. Also, well 1224 may include QW 954, with channel 934 having uni-axial strains 992 and 994 as described for FIG. 10.

Substrate 1102 also includes P-type QW 1224, and related to N-type well 1124 for forming CMOS device 1200, such that P-type well 1124 is part of n-MOS transistor device 1104 formed on a second area of substrate 1102 and defining a second different interface surface 1125 of substrate 1102 adjacent to N-type QW 1124. Specifically, for instance, n-MOS device 1104 may be formed adjacent to p-MOS device 1204 by having n-MOS device 1204 electrically isolated from p-MOS device 1204 by electrically insulating material 1110. Moreover, n-MOS device 1104 may include a QW channel below dielectric 1144, which is below gate electrode 1190, and between N-type junctions 1120 and 1130. n-MOS device 1204 is shown with spacers 1112 and 1114.

FIG. 11 also shows tensile strains 1174, 1184, 1192, and 1214 in n-MOS device 1104. For example, junctions 1120 and 1130 may cause tensile strains 1174 and 1184 away from a portion of substrate 1102 under top surface 1125. Thus, strains 1174 and 1184 may cause tensile strains 1192 and 1194 in a QW channel of n-MOS device 1104. It can be appreciated that tensile strains 1192 and 1194 may be sufficient to increase carrier mobility (e.g., mobility of electrons in the channel of well 1124) between junctions 1120 and 1130. Specifically, junctions 1120 and 1130 may be formed of a material having a smaller lattice spacing than that of a QW channel of QW 1124.

According to embodiments, n-MOS device 1104, may be an n-MOS embodiment of apparatus 500 or 1000 as described above with respect to FIGS. 5 and 10, connected to a p-MOS device 1204 in typical fashion. In these cases, gate dielectric, gate electrode, junction region, channel, and well structures of device 1104 may correspond with those described for embodiments of apparatus 500 or 1000, such as described above with respect to FIGS. 5 and 10; and p-MOS device 1204 may correspond a p-MOS device version of n-MOS device 1104 described above.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A transistor comprising:
   a quantum well in a substrate, the quantum well comprising a channel layer between a top barrier layer and a bottom buffer layer;
   a first junction region adjacent to the quantum well, the first junction region through the channel layer, and to the bottom buffer layer;
   a different second junction region adjacent to the quantum well, the second junction region through the channel layer, and to the bottom buffer layer; and
   a junction material in the first junction region and in the second junction region having a lattice spacing different than a lattice spacing of the channel material, and causing a uni-axial strain in the channel layer.

2. The transistor of claim 1, wherein the junction material has a lattice spacing larger than a lattice spacing of the channel material, and causes a uni-axial compressive strain in the channel layer.

3. The transistor of claim 1, wherein the junction material has a lattice spacing smaller than a lattice spacing of the channel material, and causes a uni-axial tensile strain in the channel layer.

4. The transistor of claim 1, wherein the junction material comprises an alloy material at an interface between the channel layer and a metal material, and wherein the alloy comprises the channel material and the metal.

5. The transistor of claim 4, wherein the metal comprises Nickel (Ni); wherein the channel material comprises germanium (Ge); wherein the top barrier and bottom buffer layer comprise silicon; and wherein the uni-axial strain is a compressive strain.

6. The transistor of claim 1, wherein the junction material comprises a graded material of the same material as the channel material on sidewall surfaces of the top barrier layer and channel layer, and on top surfaces of the bottom buffer layer.

7. The transistor of claim 6, wherein the channel material comprises Indium Gallium Arsenide (InGaAs); wherein the junction material comprises InGaAs material having a higher concentration of Indium than a concentration of Indium of the channel material; wherein the top barrier material comprises Indium Phosphide (InP); wherein the bottom buffer layer comprises Indium Aluminum Arsenide (InAlAs); and wherein the uni-axial strain is a compressive strain.

8. An apparatus comprising:
   a transistor quantum well in a substrate, the quantum well comprising a channel layer between a top barrier layer and a bottom buffer layer;
   a first junction region adjacent to a portion of the quantum well, the first junction region extending through the top barrier layer, through the channel layer, and to the bottom buffer layer;
   a different second junction region adjacent to the portion of the quantum well, the second junction region extending through the top barrier layer, through the channel layer, and to the bottom buffer layer; and
   a junction material in the first junction region and in the second junction region, the junction material having a lattice spacing greater than a lattice spacing of the channel material to cause a uni-axial compressive strain in the channel layer.

9. The apparatus of claim 8, wherein the junction material comprises an alloy material at an interface between the channel layer and a metal material, and wherein the alloy comprises the channel material and the metal.

10. The apparatus of claim 9, wherein the metal comprises Nickel (Ni); wherein the channel material comprises germanium (Ge); wherein the top barrier and bottom buffer layer comprise silicon; and wherein the uni-axial strain is a compressive strain.

11. The apparatus of claim 8, wherein the junction material comprises a graded material of the same material as the channel material on sidewall surfaces of the top barrier layer and channel layer, and on top surfaces of the bottom buffer layer.

12. The apparatus of claim 11, wherein the channel material comprises Indium Gallium Arsenide (InGaAs); wherein the junction material comprises InGaAs material having a higher concentration of Indium than a concentration of Indium of the channel material; wherein the top barrier material comprises Indium Phosphide (InP); wherein the bottom buffer layer comprises Indium Aluminum Arsenide (InAlAs); and wherein the uni-axial strain is a compressive strain.

13. An apparatus comprising:
   a transistor quantum well in a substrate, the quantum well comprising a channel layer between a top barrier layer and a bottom buffer layer;
   a first junction region adjacent to a portion of the quantum well, the first junction region extending through the top barrier layer, through the channel layer, and to the bottom buffer layer;
   a different second junction region adjacent to the portion of the quantum well, the second junction region extending through the top barrier layer, through the channel layer, and to the bottom buffer layer; and
   a junction material in the first junction region and in the second junction region, the junction material having a lattice spacing smaller than a lattice spacing of the channel material to cause a uni-axial tensile strain in the channel layer.

14. The apparatus of claim 13, wherein the top barrier layer and the bottom buffer layer each comprise a material having a lattice spacing larger than a lattice spacing of a channel material of the channel layer to each cause a bi-axial tensile strain in the channel layer, in addition to the uni-axial compressive strain.

15. The apparatus of claim 14, wherein the junction material comprises an alloy material at an interface between the channel layer and a metal material, and wherein the alloy comprises the channel material and the metal.

16. The apparatus of claim 15, wherein the metal comprises Nickel (Ni); wherein the channel material comprises germanium (Ge); wherein the top barrier and bottom buffer layer comprise silicon; and wherein the uni-axial strain and the hi-axial strains are compressive strains.

17. The apparatus of claim 13, wherein the junction material comprises a graded material of the same material as the channel material on sidewall surfaces of the top barrier layer and channel layer, and on top surfaces of the bottom buffer layer.

* * * * *